(12) United States Patent
Sun et al.

(10) Patent No.: US 7,907,641 B2
(45) Date of Patent: Mar. 15, 2011

(54) METHOD AND APPARATUS FOR PROVIDING SIGNAL ACQUISITION AND FRAME SYNCHRONIZATION IN A HIERARCHICAL MODULATION SCHEME

(75) Inventors: Feng-Wen Sun, Germantown, MD (US); Lin-Nan Lee, Potomac, MD (US)

(73) Assignee: DTVG Licensing, Inc., El Segundo, CA (US)

( * ) Notice: Subject to any disclaimer, the term of this patent is extended or adjusted under 35 U.S.C. 154(b) by 1202 days.

(21) Appl. No.: 10/819,668

(22) Filed: Apr. 7, 2004

(65) Prior Publication Data

US 2005/0089068 A1    Apr. 28, 2005

Related U.S. Application Data

(60) Provisional application No. 60/514,682, filed on Oct. 27, 2003.

(51) Int. Cl.
*H04J 3/12* (2006.01)
*H04J 3/04* (2006.01)
*H04L 27/36* (2006.01)

(52) U.S. Cl. .......................... 370/522; 370/535; 375/298

(58) Field of Classification Search ........................ None
See application file for complete search history.

(56) References Cited

U.S. PATENT DOCUMENTS

| | | | |
|---|---|---|---|
| 6,658,381 B1 * | 12/2003 | Hellwig et al. | 704/216 |
| 7,315,582 B2 * | 1/2008 | Chouly et al. | 375/308 |
| 7,319,659 B2 * | 1/2008 | Tsuie | 370/203 |
| 7,433,296 B2 * | 10/2008 | Tsuie | 370/203 |
| 2007/0011716 A1 * | 1/2007 | Koslov et al. | 725/135 |
| 2007/0025283 A1 * | 2/2007 | Koslov | 375/264 |
| 2007/0030398 A1 * | 2/2007 | Koslov et al. | 348/724 |

FOREIGN PATENT DOCUMENTS

| | | |
|---|---|---|
| WO | WO 01/29999 | 4/2001 |
| WO | WO 2005020530 | * 3/2005 |

OTHER PUBLICATIONS

Mignone, DVB-S2 Second generation system for satellite and unicast transmission, Electronica e telecomunicazioni, No. 3, Dec. 2003, pp. 1-56.*

Rohde & Schwartz; Broadcasting—Test Transmitters; "New Coder for DVB-S/-DSNG and DVB-C Standards"; News from Rohde & Schwartz; vol. 2002/II, No. 174; 2002; pp. 38-41; Xp-002407827.

MacKay, D.J.C., Neal, R.M.; "Near Shannon Limit Performance of Low Density Parity Check Codes"; Electronics Letters; IEE Stevenege, GB; vol. 32, No. 18; Aug. 29, 1996; pp. 1645-1646; XP-006005648.

(Continued)

*Primary Examiner* — Steven H Nguyen

(57) ABSTRACT

An approach is provided for supporting signal acquisition and frame synchronization in a digital broadcast system utilizing Low Density Parity Check (LDPC) codes. Hierarchical modulation is utilized to provide backward compatibility, whereby the lower layer signal is encoded using LDPC coding. A signal is received, whereby the signal is modulated according to the hierarchical modulation scheme including an upper layer and a lower layer. The signal includes a data pattern and a coded frame. The dependency of the received signal on the upper layer modulation is removed. The modulation removed signal is correlated with multiple predetermined data patterns to determine the data pattern of the signal. The code rate of the coded frame is derived based on the determined data pattern. The above arrangement is particularly suited to a digital satellite broadcast system.

19 Claims, 11 Drawing Sheets

OTHER PUBLICATIONS

Drury, G.M.; "DVB Channel Coding Standards for Broadcasting Compressed Video Services"; Electronics and Communication Engineering Journal; Institution of Electrical Engineers; London, Great Britain; vol. 9, No. 1; Feb. 1997; pp. 11-20; XP-000722904.

Chinese Office Action dated Aug. 22, 2008 in Chinese counterpart Application No. 200410059236.9 corresponding to U.S. Appl. No. 10/819,668, filed Apr. 7, 2004 by Feng-Wen Sun et al.

Chinese Office Action dated Apr. 3, 2009 in Chinese Patent Application No. 200410059236.9 filed Jun. 14, 2004 by Feng-Wen Sun et al.

European Patent Office communication dated Nov. 5, 2009 in European Patent Application No. 04253462.8 filed Jun. 10, 2004 by Feng-Wen Sun et al.

Chinese Office action dated Nov. 27, 2009 in Chinese Patent Application No. 200410059236.9 filed Jun. 14, 2004 by Feng-Wen Sun et al.

Canadian Office action dated Mar. 24, 2010 in Canadian Patent Application No. 2,470,795 filed Jun. 11, 2004 by Feng-Wen Sun et al.

\* cited by examiner

US 7,907,641 B2

METHOD AND APPARATUS FOR PROVIDING SIGNAL ACQUISITION AND FRAME SYNCHRONIZATION IN A HIERARCHICAL MODULATION SCHEME

RELATED APPLICATIONS

This application claims the benefit of the earlier filing date under 35 U.S.C. §119(e) of U.S. Provisional Patent Application Ser. No. 60/514,682, filed Oct. 27, 2003, titled "Signal Acquisition and Frame Synchronization for the Lower Layer of Hierarchical 8-PSK Modulation"; the entirety of which is incorporated herein by reference.

FIELD OF THE INVENTION

The present invention relates to communication systems, and more particularly to digital communication systems.

BACKGROUND OF THE INVENTION

Digital satellite video broadcast has been tremendously successful throughout the world ever since the emergence of the Digital Video Broadcasting via Satellite (DVB-S) standard. However, the DVB-S is based on the state of art technologies available at the inception of the standard; these technologies are now dated. As signal processing technologies evolve—in particular, the breakthrough in error correction coding—more efficient ways to utilize the spectral and satellite powers are possible. Unfortunately, any introduction of new technologies to a successful platform likely entails service interruption and absorbing the heavy cost of replacing the legacy equipment. In this scenario, there are millions and millions of receivers already deployed based on DVB-S. The replacement of these equipment would be astounding, running into the billions of dollars. Therefore, there is a need for a mechanism to provide a smooth, cost effective transition from the current platform to the next generation systems.

It is recognized that hierarchical modulation provides such a mechanism to structure the signal constellation into two layers: one layer (the upper layer) conforming with the legacy technology (therefore equipment), and the other layer (the lower layer) supports new services. In this configuration, the upper layer signal can be received by both the legacy and new equipment. Importantly, this will not interrupt the legacy service, and the new equipment can receive both layers to enjoy the additional services. On the other hand, this approach is less spectral and/or power efficient than a non-backward compatible scheme. Also, the new receiving equipment will need to be equipped with non-backward compatible modes as well. As the legacy equipment is phased out, the system can gradually transition to the non-backward compatible modes, perhaps on a transponder by transponder basis.

In systems employing hierarchical modulation, rapid and efficient signal acquisition and frame synchronization poses a challenge. Traditionally, frame synchronization has not been an area of major concern for conventional broadcast and/or continuous transmission systems employing convolutional code since decoding can be performed prior to frame synchronization. The post decoding frame synchronization can benefit from the coding gain offered by the error correction codes. For instance, the DVB-S standard has been widely adopted worldwide to provide, for example, digital satellite television programming. Traditional DVB compliant systems employ fixed modulation and coding schemes. At present, such DVB compliant systems utilize Quadrature Phase Shift Keying (QPSK) modulation and concatenated convolutional code and Reed-Solomon channel coding. Given the fact that modulation and coding schemes are fixed, and the fact that the continuous transmission nature of broadcasting or unicasting, a simple framing structure can be utilized for these applications. In actuality, the only framing overhead is a Synchronization ("SYNC") byte attached to a MPEG 2 (Moving Pictures Experts Group-2) frame. The SYNC byte is treated the same as other data by the convolutional code and the Reed-Solomon encoder. At the receiving end, the data corrupted by the communication media are first recovered by the convolutional code. The convolutional code can function without the knowledge of the framing structure. The output of the convolutional code is of high fidelity, typically at bit error rate below $1 \times 10^{-5}$. With the high fidelity output, simple data matching with the SYNC byte is able to identify the starting point of the MPEG frame. Therefore, the transmitted data can be properly reassembled to deliver to the next layer. However, with block coded system, frame synchronization has been achieved before decoding. Especially when the receiver has to determine which modulation and coding is used among a vast amount of potential combinations of modulation and coding schemes. Modern error correction coding, such as low density parity check codes, operates at extremely low signal to noise ratios. This implies that such frame synchronization needs to be achieved at the same low signal to noise ratios. Furthermore, frame synchronization in such system is more than to find the beginning and ending point of a frame, it also needs to identify the modulation and coding scheme employed in the frame.

Under these conditions, the conventional approaches to frame synchronization do not operate well in that the requirements of high fidelity outputs, for example, can no longer be guaranteed.

Consequently, other approaches have been developed, but require incurring significant overhead (i.e., reduction in throughput) and receiver complexity. For example, one approach suggests using a forward error correction coding, such as a Bose Chaudhuri Hocquenghem (BCH) code, to protect the framing information within the frame structure. At the receiving end, the receiver searches for the unique word first by correlation. Once the unique word is detected, the BCH coded framing information is decoded coherently by a maximum likelihood correlation decoding. A drawback of this technique is that the unique word has to be large (i.e., high overhead). Another drawback is that true maximum likelihood decoding of the BCH code is quite complex. Furthermore schemes with these kinds of nature, i.e., using training symbols, cannot preserve the backward compatibility in a hierarchical modulation.

Therefore, there is a need for a frame synchronization mechanism that provides rapid acquisition without incurring large overhead costs, while ensuring backward compatibility with deployed technologies and services. There is also a need for a frame synchronization approach that is simple to implement. There is also a need to provide a synchronization technique that is flexible as to provide coding and modulation independence.

SUMMARY OF THE INVENTION

These and other needs are addressed by the present invention, wherein an approach is provided to support signal acquisition and frame synchronization for the lower layer of the hierarchical modulation in a digital broadcast system utilizing Low Density Parity Check (LDPC) codes. Hierarchical modulation is utilized to provide backward compatibility, whereby the lower layer signal is encoded using LDPC coding. In an exemplary embodiment, the upper layer utilizes Quadrature Phase Shift Keying (QPSK) and the lower layer uses Binary Phase Shift Keying (BPSK). A signal is received, whereby the signal is modulated according to the hierarchical modulation scheme including an upper layer and a lower layer. The signal includes a data pattern and a coded frame. The dependency of the received signal on the upper layer modulation is removed. The modulation removed signal is correlated with multiple predetermined data patterns to determine the data pattern of the signal. The code rate of the coded frame is derived based on the determined data pattern. The above arrangement advantageously provides rapid and reliable frame acquisition without additional overhead.

According to one aspect of an embodiment of the present invention, a method for generating a hierarchical modulation signal in a communication system is disclosed. The method includes receiving an upper layer data stream and a lower layer data stream; and modifying the lower layer data stream by inserting a data pattern that is code rate dependent to precede the lower layer data stream. The method also includes combining the upper layer data stream and the modified lower layer data stream. Further, the method includes selecting one of a plurality of hierarchical signal constellation points based on the combined data streams.

According to another aspect of an embodiment of the present invention, a method for acquiring a signal in a communication system is disclosed. The method includes receiving a signal that is modulated according to a hierarchical modulation scheme including an upper layer and a lower layer. The signal includes a data pattern and a coded frame. Also, the method includes removing dependency of the received signal on the upper layer modulation; and correlating the modulation removed signal with a plurality of data patterns. The method further includes determining which one of the plurality of data patterns corresponds to the data pattern of the signal; and deriving code rate of the coded frame based on the determined one of the data patterns.

According to another aspect of an embodiment of the present invention, a method for generating a signal in a communication system supporting a hierarchical modulation scheme is disclosed. The method includes generating an upper layer data stream having a first framing structure. The method also includes generating a lower layer data stream having a second framing structure, wherein the first framing structure is not a multiple of the second framing structure, a starting point of the lower layer data stream corresponding only to a subset of upper layer positions. Further, the method includes outputting the signal, wherein the signal represents a constellation point in the hierarchical modulation scheme associated with a combination of the data streams.

According to another aspect of an embodiment of the present invention, a method for acquiring the frame synchronization in a hierarchical modulation scheme is disclosed. The method includes decoding an upper layer signal; and acquiring frame synchronization of the upper layer signal. The method also includes initiating frame synchronization of a lower layer signal that is encoded according to a forward error correction code, wherein the lower layer signal includes an embedded data pattern. The method further includes decoding of the lower layer signal based on the forward error correction code prior to the step of initiating frame synchronization of the lower layer; and searching for the data pattern embedded in the lower layer signal.

According to another aspect of an embodiment of the present invention, a method for supporting frame synchronization in a digital communication system is disclosed. The method includes searching over a predetermined window length for a peak value within a frame, wherein the peak value corresponds to a maximum correlation value associated with one of a plurality of sequences that specify different code rates of a lower layer signal of a received signal that is modulated according to a hierarchical modulation scheme. The method also includes designating the peak value as a candidate, and verifying the candidate. The method further includes declaring acquisition of the frame if the candidate is verified.

According to yet another aspect of an embodiment of the present invention, a receiver for supporting frame synchronization in a digital communication system is disclosed. The receiver includes means for searching over a predetermined window length for a peak value within a frame, wherein the peak value corresponds to a maximum correlation value associated with one of a plurality of sequences that specify different code rates of a lower layer signal of a received signal that is modulated according to a hierarchical modulation scheme. The receiver also includes means for designating the peak value as a candidate; means for verifying the candidate; and means for declaring acquisition of the frame if the candidate is verified.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements and in which.

DESCRIPTION OF THE PREFERRED EMBODIMENT

An apparatus, method, and software for efficiently providing signal acquisition and frame synchronization in a digital broadcast system are described. In the following description, for the purposes of explanation, numerous specific details are set forth in order to provide a thorough understanding of the present invention. It is apparent, however, to one skilled in the art that the present invention may be practiced without these specific details or with an equivalent arrangement. In other instances, well-known structures and devices are shown in block diagram form in order to avoid unnecessarily obscuring the present invention.

Figure 1:
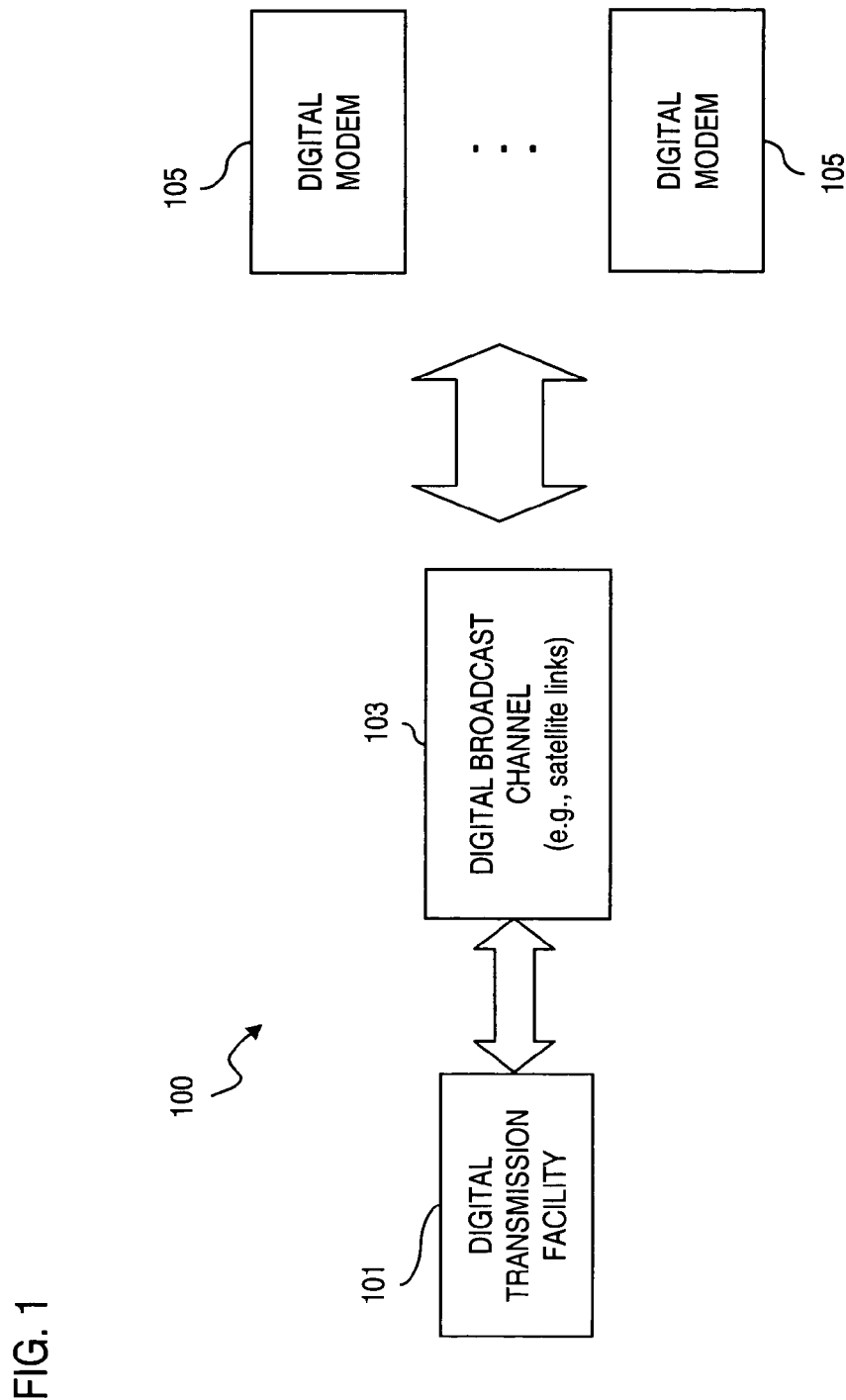
FIG. 1 is a diagram of a digital broadcast system configured to utilize Low Density Parity Check (LDPC) codes, according to an embodiment of the present invention.

FIG. 1 is a diagram of a digital broadcast system configured to utilize Low Density Parity Check (LDPC) codes, according to an embodiment of the present invention. The digital communications system 100 includes a digital transmission facility 101 that generates signal waveforms for broadcast across a communication channel 103 to one or more digital modems 105. According to one embodiment of the present invention, the communication system 100 is a satellite communication system that supports, for example, audio and video broadcast services as well as interactive services. Interactive services include, for example, electronic programming guides (EPGs), high-speed internet access, interactive advertising, telephony, and email services. These interactive services can also encompass such television services as Pay Per View, TV Commerce, Video On Demand, Near Video On Demand and Audio On Demand services. In this environment, the modems 105 are satellite modems. To provide for backward compatibility, the system 100 utilizes a hierarchical modulation scheme (as detailed in FIG. 3).

In this communication system 100, the transmission facility 101 transmits two different data streams, each of which represents media content (e.g., audio, video, textual information, data, etc.); each of the possible messages has a corresponding signal waveform. These signal waveforms are attenuated, or otherwise altered, by communications channel 103. To combat the noise channel 103, the transmission facility 101 utilizes forward error correction coding.

According to one embodiment of the present invention, the lower layer benefits from the advancement of channel approaching forward error correction coding, such as LDPC. As such, the system 100 operates at unprecedented low signal to noise ratio. In broadcast applications supported by the system 100, rapid frame synchronization in low signal-to-noise (SNR) environments is necessary to avoid negatively impacting user experience, as well as utilizing system resources efficiently.

Figure 2:
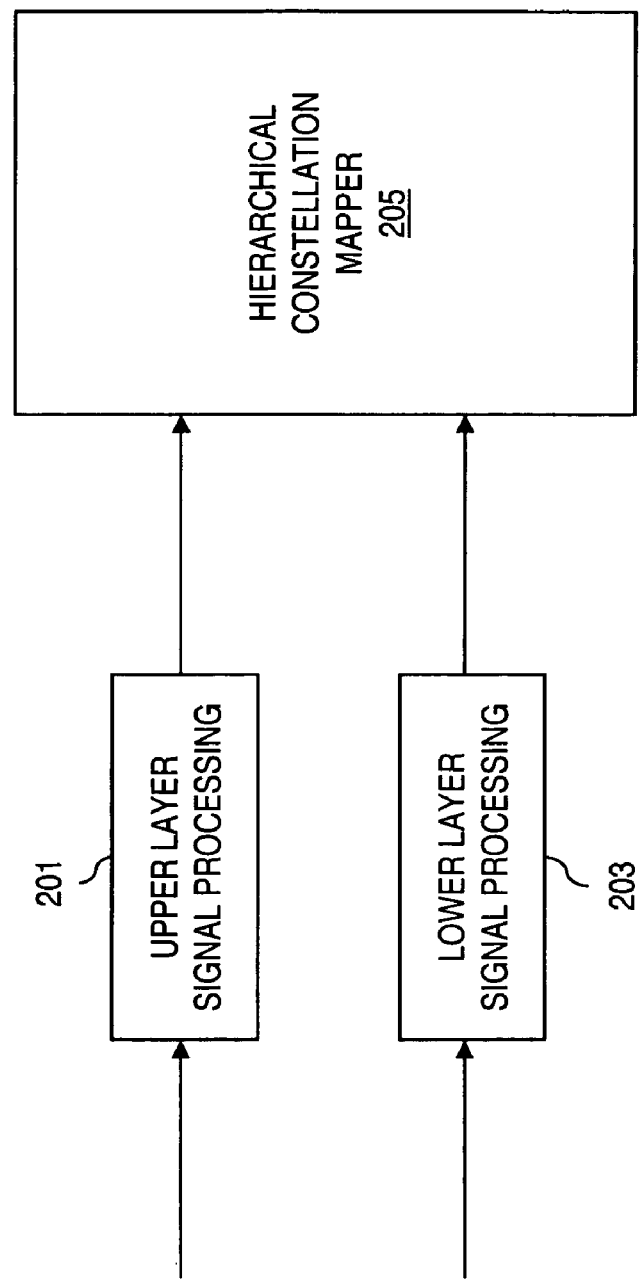
FIG. 2 is a diagram of a hierarchical constellation mapper employed in the digital transmission facility of the system of FIG. 1.

FIG. 2 is a diagram of a hierarchical constellation mapper employed in the digital transmission facility of the system of FIG. 1. An upper layer signal processing unit 201 and a lower layer signal processing unit 203 provide baseband signal processing prior to mapping to a final signal constellation by a hierarchical constellation mapper 205. According to one embodiment of the present invention, these units 203, 205 individually perform forward error correction coding, and scrambling. The combined data stream utilizes capacity achieving coding, such as LDPC codes; such capacity achieving code operates at relatively low signal to noise ratio, thus imposing additional challenges with respect to signal acquisition and synchronization.

According to an embodiment of the present invention, the lower layer frame is structured with respect to upper layer frames such that the framing information derived from the upper layer assists with reducing the searching space of lower layer frame starting point, thereby advantageously reducing the complexity of the lower layer frame synchronization.

Figure 3:
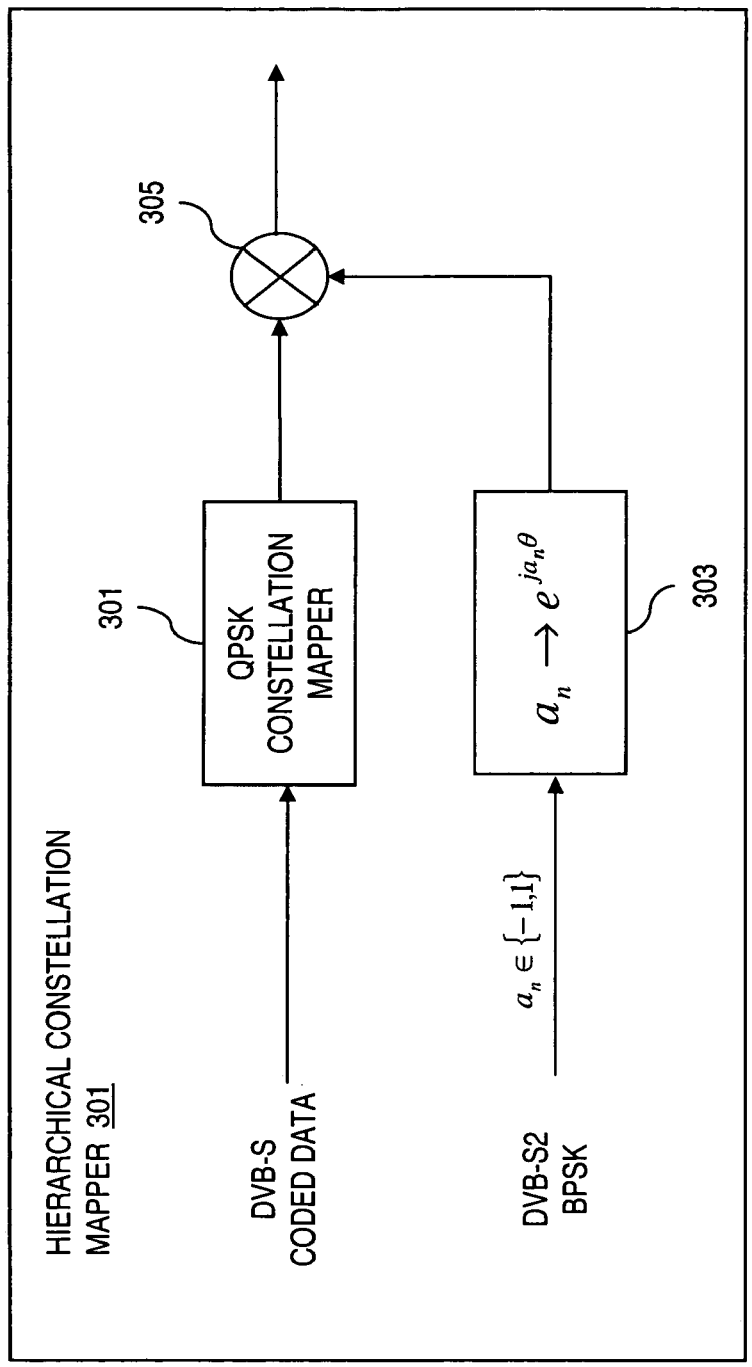
FIG. 3 is a diagram of a hierarchical constellation mapper for hierarchical 8-PSK (Phase Shift Keying) modulation, in accordance with an embodiment of the present invention.

FIG. 3 is a diagram of a hierarchical constellation mapper for hierarchical 8-PSK (Phase Shift Keying) modulation, in accordance with an embodiment of the present invention. A hierarchical modulation scheme (e.g., 8-PSK) can be employed to support backward compatible modulation with legacy systems, while implementing "newer" systems (or protocols); such an approach can be applied to the Digital Video Broadcasting via Satellite (DVB-S) standards, notably, DVB-S2 and DVB-S. By way of example, the upper layer complies with DVB-S, while the lower layer adopts the DVB-S2 format. In cases wherein DVB-S receivers are widely deployed, it would not be cost-effective to completely replace these "older" or "legacy" receivers with receivers that were designed to accommodate the "newer" DVB-S2 standard. Under this approach, receivers compliant with both DVB-S and DVB-S2 can be deployed.

As shown, coded data streams corresponding to a received signal are input to a standard Quadrature Phase Shift Keying (QPSK) constellation mapper 301. The QPSK constellation mapper 301 conforms to the DVB-S specification and maps a binary signal into a phase angle. The angle is a system parameter determined by the available power of the system 100. The constellation mapper 301 creates a signal constellation, as shown in FIG. 4.

In addition, a lower layer transmits another data stream independent of the upper layer, whereby the lower layer can be Binary Phase Shift Keying (BPSK) modulated. The BPSK modulated data is converted to phase information associated with a predetermined angle θ by a converter 303. The angle θ can be determined based on the available power. The modulated upper and lower layers are then multiplied by a multiplier 305. According to one embodiment of the present invention, the multiplied signal is further pulse-shaped.

Signal acquisition involves determining whether a lower layer signal exists. If the lower layer signal is provided, the module 301 then determines θ. According to an embodiment of the present invention, the lower layer is coded with Low Density Parity Check (LDPC) code. LDPC codes are typically rather long, for instance, of length 64,800 bits per LDPC coded frame. In order to properly decode the LDPC code, the receiver needs to first achieve frame synchronization.

Figure 4:
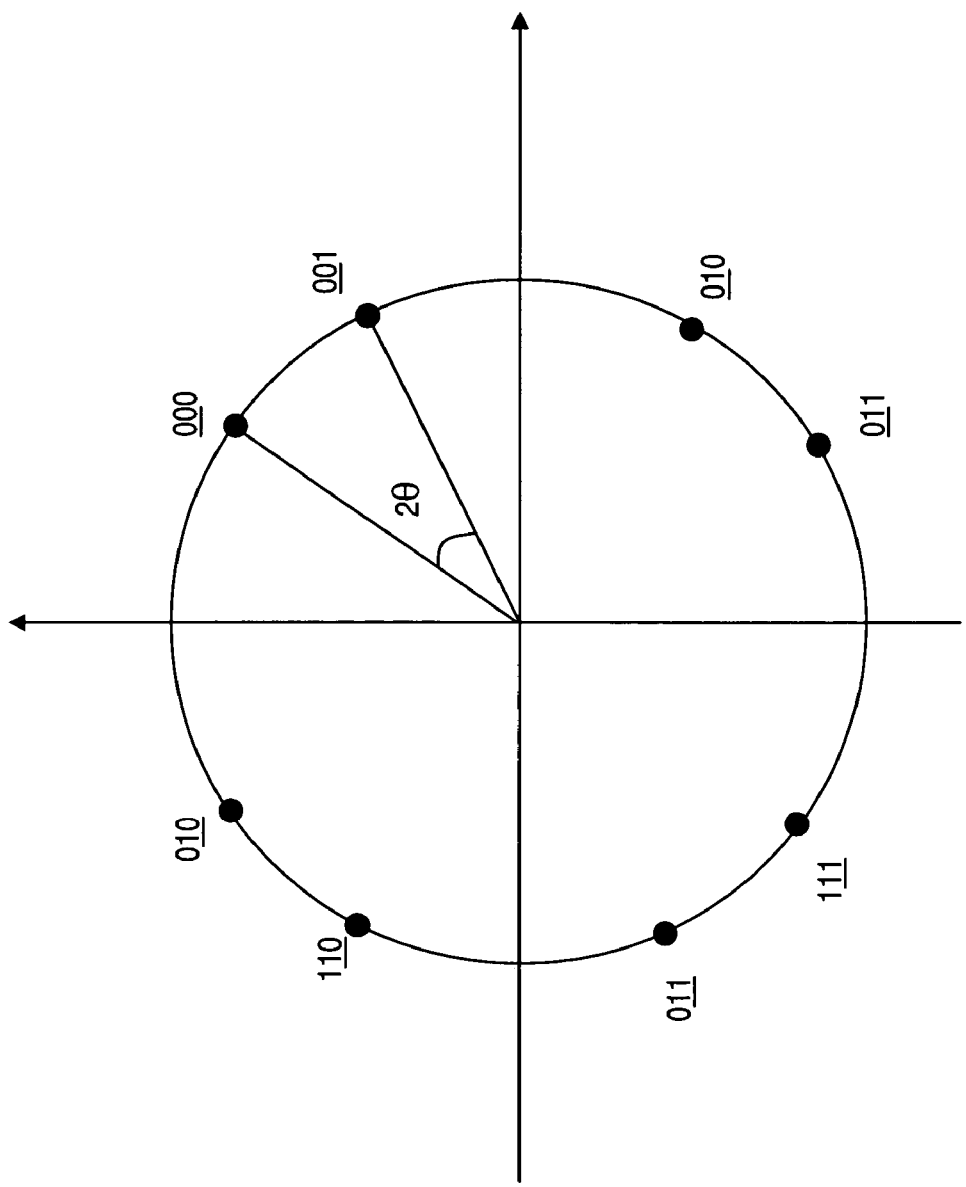
FIG. 4 is a diagram of an exemplary signal constellation used by the hierarchical constellation mapper of FIG. 2.

FIG. 4 is a diagram of an exemplary signal constellation used by the hierarchical constellation mapper of FIG. 2. As seen in FIG. 4, the two bits that are underscored represent the upper layer. The constellation 400 chooses two bits from the upper layer and one bit from the lower layer to select one of the points of the hierarchical constellation point. It is recognized that other equivalent labeling of the constellation can be utilized; for instance, the constellation can be labeled based on Gray labeling. In any configuration, to maintain the backward compatibility, the upper layer is mapped in the manner defined by the particular legacy system (e.g., DVB-S system).

Under the above arrangement, the upper layer can be received by any legacy receiver employing traditional digital receiver design technologies. In fact, the upper layer receiver does not need to be aware of the existence of the lower layer. The received signal is timing and carrier phase synchronized for the upper layer before it is passed to the upper layer forward error correction coding. Since the lower layer is subjected to the same timing and carrier phase impairments, the lower layer has the benefit of the achieved timing and carrier phase synchronization of the upper layer.

Before the lower layer LDPC decoder can function, the framing information of the LDPC code, which includes the starting point of a LDPC coded frame and the code rate of the LDPC code, has to be acquired. This aspect significantly differs from the upper layer processing. Firstly, the lower layer operates at low signal-to-noise ratios, typically, at Es/No below 0 dB. Secondly, the lower layer needs to recover the framing information to proceed to LDPC decoding, whereas the upper layer can be first decoded, as convolutional coding can be self synchronized without using any framing information. This suggests that upper layer framing recovery can benefit from the coding gain of the forward error correction coding. In contrast, the lower layer cannot benefit from the coding gain. Furthermore, in order to maintain backward compatibility, any framing information of the lower layer has to be carried strictly in the lower layer. At any given transmission epoch, both upper and lower layers are used to determine the signal point to be transmitted; thus, the transmission of known signal points for training the lower layer cannot be used.

To facilitate the frame synchronization, in one embodiment of the present invention, periodic data patterns are inserted into the lower layer streams. The periodic data patterns vary with the code rate of the LDPC.

Figure 5:
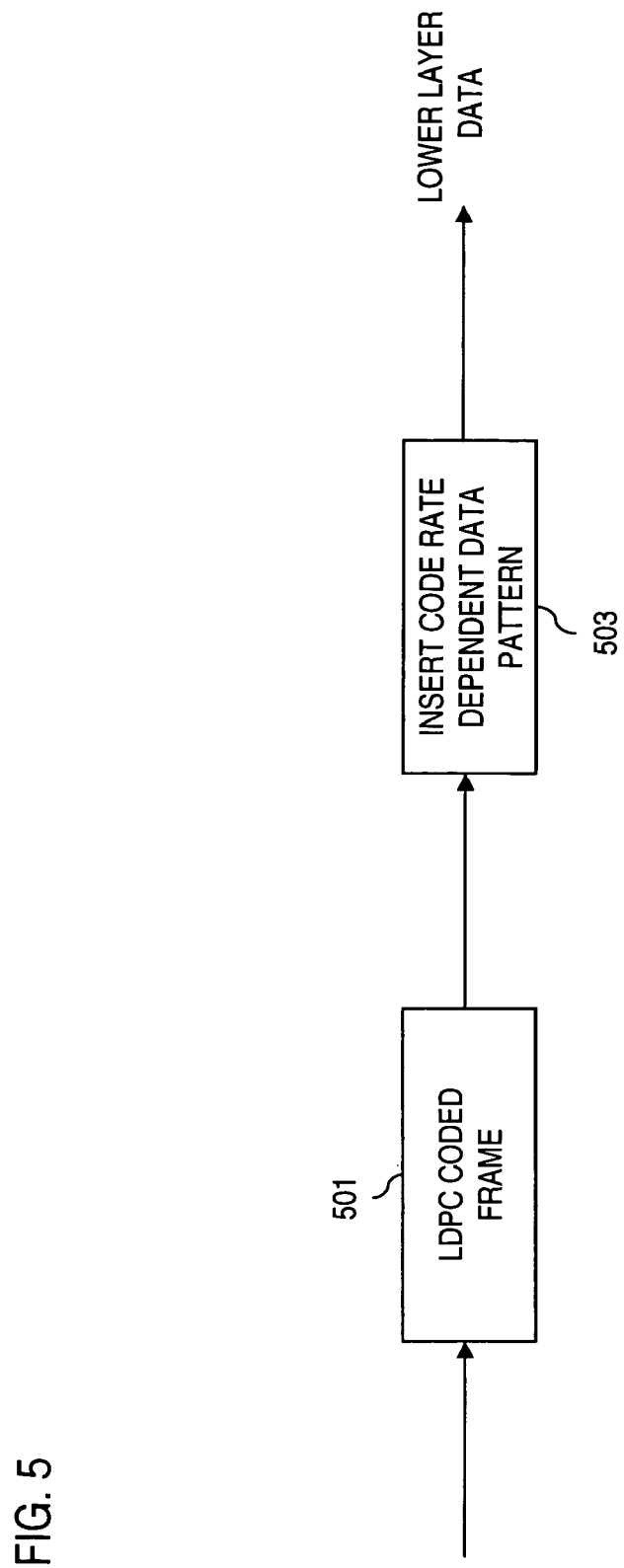
FIG. 5 is a diagram of a process for inserting data patterns in the lower layer data stream, in accordance with an embodiment of the present invention.

FIG. 5 is a diagram of a process for inserting data patterns in the lower layer data stream, in accordance with an embodiment of the present invention. A LDPC coded frame 501 is preceded with a code rate dependent data pattern 503 to form the lower layer transmitted data. Because the data pattern essentially carries the framing information, the structure of this pattern has to exhibit good autocorrelation and cross-correlation properties. Good autocorrelation property is critical for detection of the data pattern, as to locate the starting point of the LDPC coded frame 501. Additionally, good cross-correlation property is critical for reliably recovering the framing information.

Another factor in the proper design of the data pattern involves the length. Clearly, from the perspective of reducing overhead, a shorter data pattern results in greater efficiency. Accordingly, the tradeoff is between overhead and performance is made. In one embodiment, 90 bit data patterns are selected for use with the mapper 301 of FIG. 3 as providing a good balance between overhead cost and performance gain.

In an exemplary embodiment, four different sequences, or data patterns, which exhibit good autocorrelation and cross-correlation properties, are defined as follows in Table 1:

Table 2 enumerates the corresponding octal representation of the binary sequences of Table 1:

TABLE 2

| Seq. | |
|---|---|
| 1 | 4416475506033002140572621247 12 |
| 2 | 7530125306432214063262171033 00 |
| 3 | 2471242327501420066030557134 11 |
| 4 | 0066047423263014226130652406 57 |

Each of the sequences in the above tables corresponds to one code rate of the LDPC. For instance, the sequences 1-4 can represent rate 1/4, 1/3, 1/2, and 3/5 codes, respectively. The sequence corresponds to the code rate of the LDPC coded frame is attached to each of the LDPC coded frame.

Figure 6B:
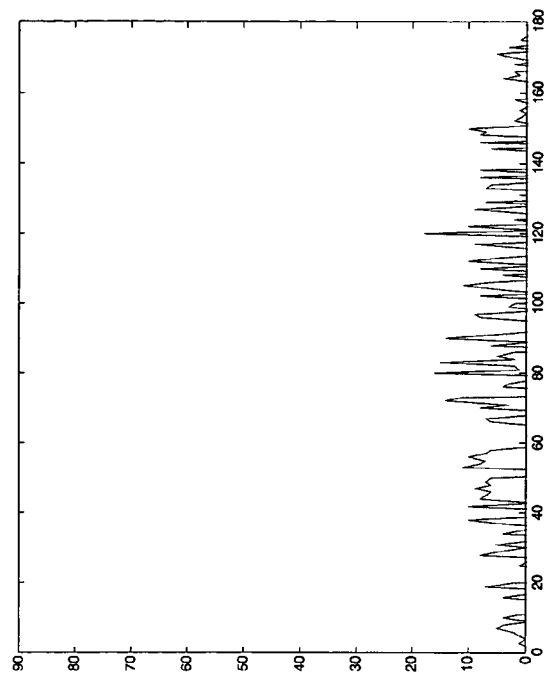
FIGS. 6A-6C are graphs showing the autocorrelation and cross-correlation properties of code sequences used as the data patterns in the process of FIG. 5, in accordance with an embodiment of the present invention.
Figure 6A:
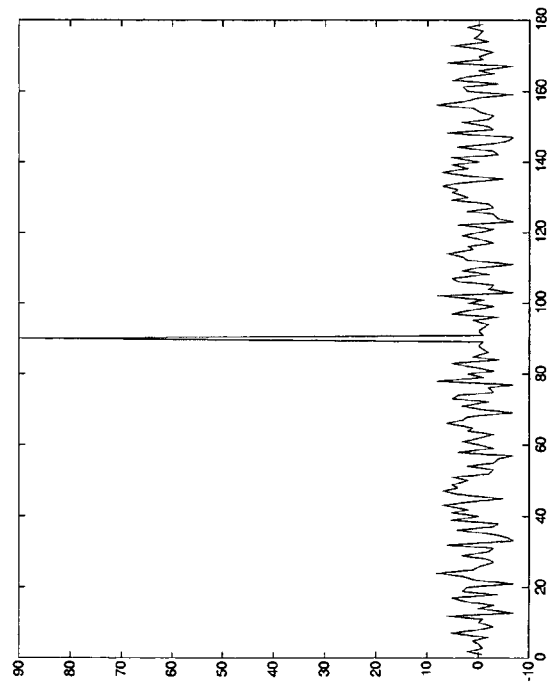
Figure 6C:
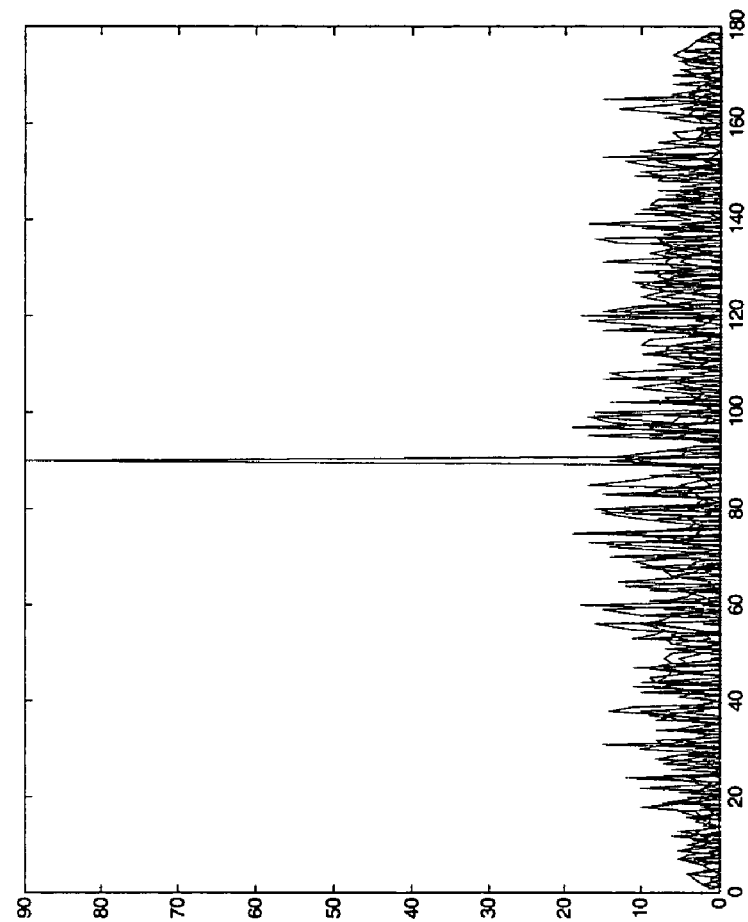

FIGS. 6A-6C are graphs showing the autocorrelation and cross-correlation properties of code sequences employed as data patterns in the process of FIG. 5, in accordance with an embodiment of the present invention. Specifically, FIG. 6A shows the autocorrelation of these sequences. FIG. 6B provides a graph of the cross-correlation of the sequences, while FIG. 6C illustrates both the autocorrelation and cross-correlation properties associated with the sequences of Tables 1 and 2. As seen in these figures, the code sequences yield good autocorrelation and cross-correlation properties.

To achieve proper synchronization, the upper layer modulation is first removed before the received data is processed with respect to the lower layer frame synchronization and decoding.

Figure 7:
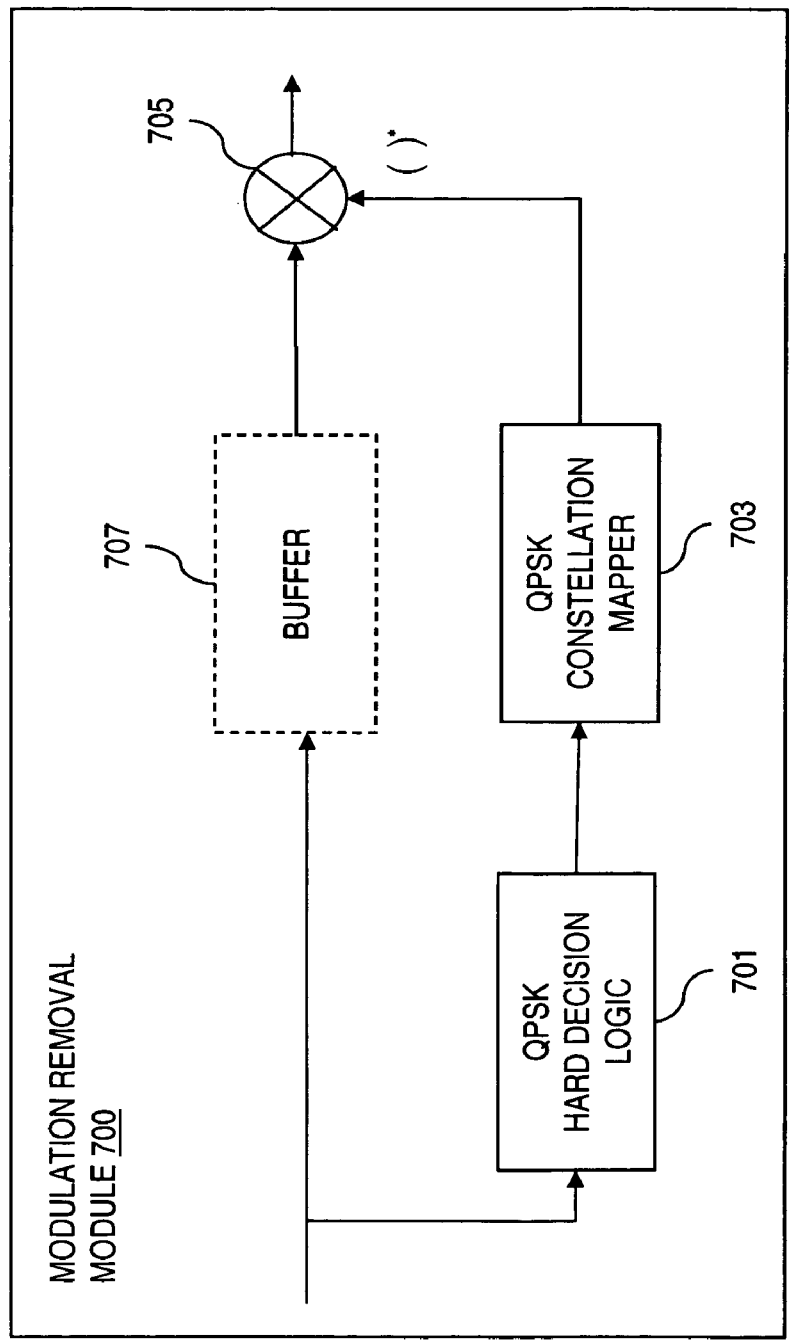
FIG. 7 is a diagram of a module for removing upper layer modulation, in accordance with an embodiment of the present invention.

FIG. 7 is a diagram of a module for removing upper layer modulation, in accordance with an embodiment of the present invention. Consistent with the operation of the mapper 301 of FIG. 3, a modulation removal module 700 includes a QPSK hard decision logic 701 outputting to a QSPK Constellation Mapper 703. A received data stream is re-modulated back into a QPSK signal point by the mapper 703. An optional buffer 707 can be utilized to account for the potential processing delay of the QPSK hard decision logic 701 and the QPSK Constellation Mapper 703. The conjugate of the remodulated signal is multiplied with the buffered signal to remove the upper layer modulation.

Because the hard decision performed by the logic 701 may suffer performance loss, the signal may be decoded by the upper layer coding scheme and re-encoded and re-interleaved to generate the decision of the upper layer having improved fidelity. It is contemplated that other techniques for modulation removal can be utilized. For instance, if Gray mapping were used for the hierarchical constellation, the process simply involves determining the difference between the absolute value of in-phase signal and the absolute value of the quadrature phase signal.

Figure 8:
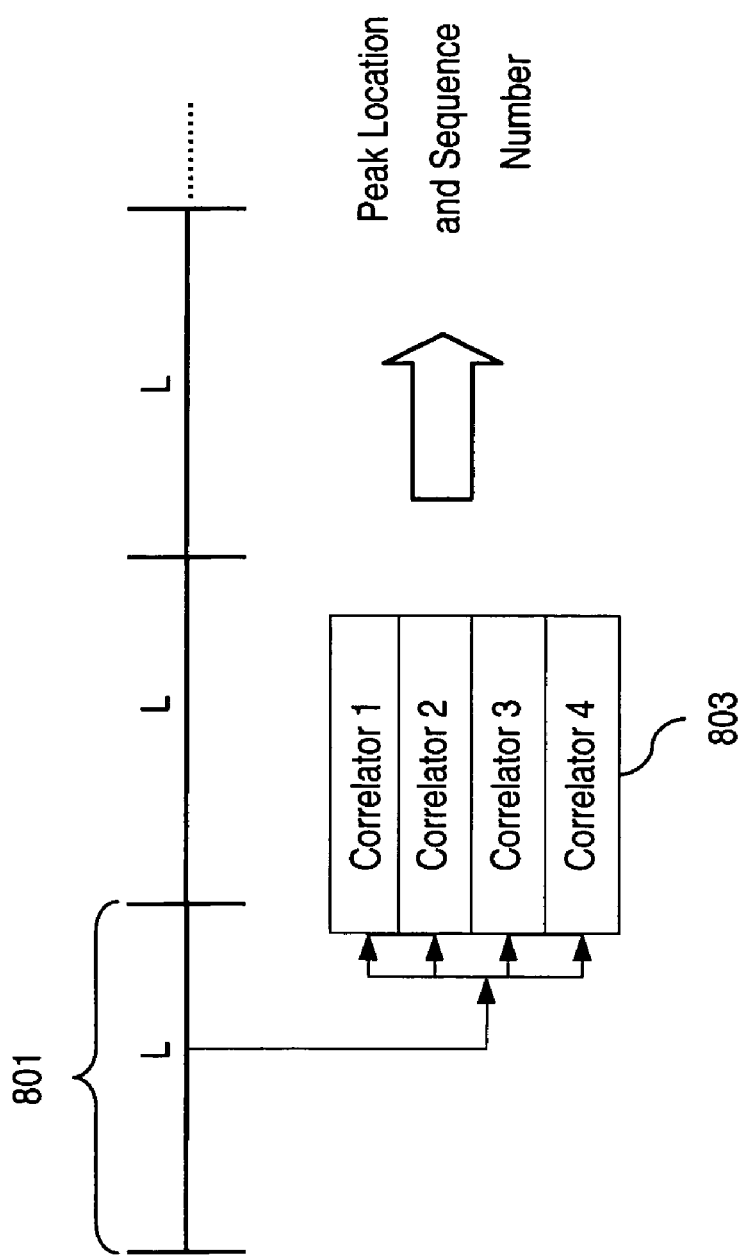
FIG. 8 is a diagram of a peak search detection scheme to locate a data pattern, in accordance with an embodiment of the present invention.

FIG. 8 is a diagram of a peak search detection scheme to locate a data pattern, in accordance with an embodiment of the present invention. The peak search detection scheme provides for rapid frame acquisition by searching for a peak

TABLE 1

| Seq. | |
|---|---|
| 1 | 100100001110100111101101000110000011011000000010001100000101111010110010001010100111001010 |
| 2 | 111101011000001010101011000110100011010010001100000110011010011001000111100100001011000000 |
| 3 | 010100111001010100010011010111101000001100010000000110110000011000101101111001011100001001 |
| 4 | 000000110110000100111100010011010110011000001100010010110001011000110101010100000110101111 | value associated with multiple correlators within a search window 801 and designates this peak value as a candidate by storing the information in a buffer 803 as a candidate. By way of example, the four correlators correspond to four different possible data patterns (e.g., Table 1). This search can be conducted over multiple search windows 801, resulting in other candidates. After each search, the candidate is verified by deriving the location of the next peak from the particular candidate. If the prediction is correct and the data pattern matches, an acquisition is declared.

This above process advantageously provides rapid acquisition over the conventional peak search process. The conventional peak search process sets up a threshold once there is one correlation that is above the threshold. In such a case, a candidate is acquired. Thereafter, the process verifies whether it is a valid data pattern. This conventional approach is slow because the thresholding can yield numerous candidates, whereby the verification process is executed for each candidate.

Figure 9:
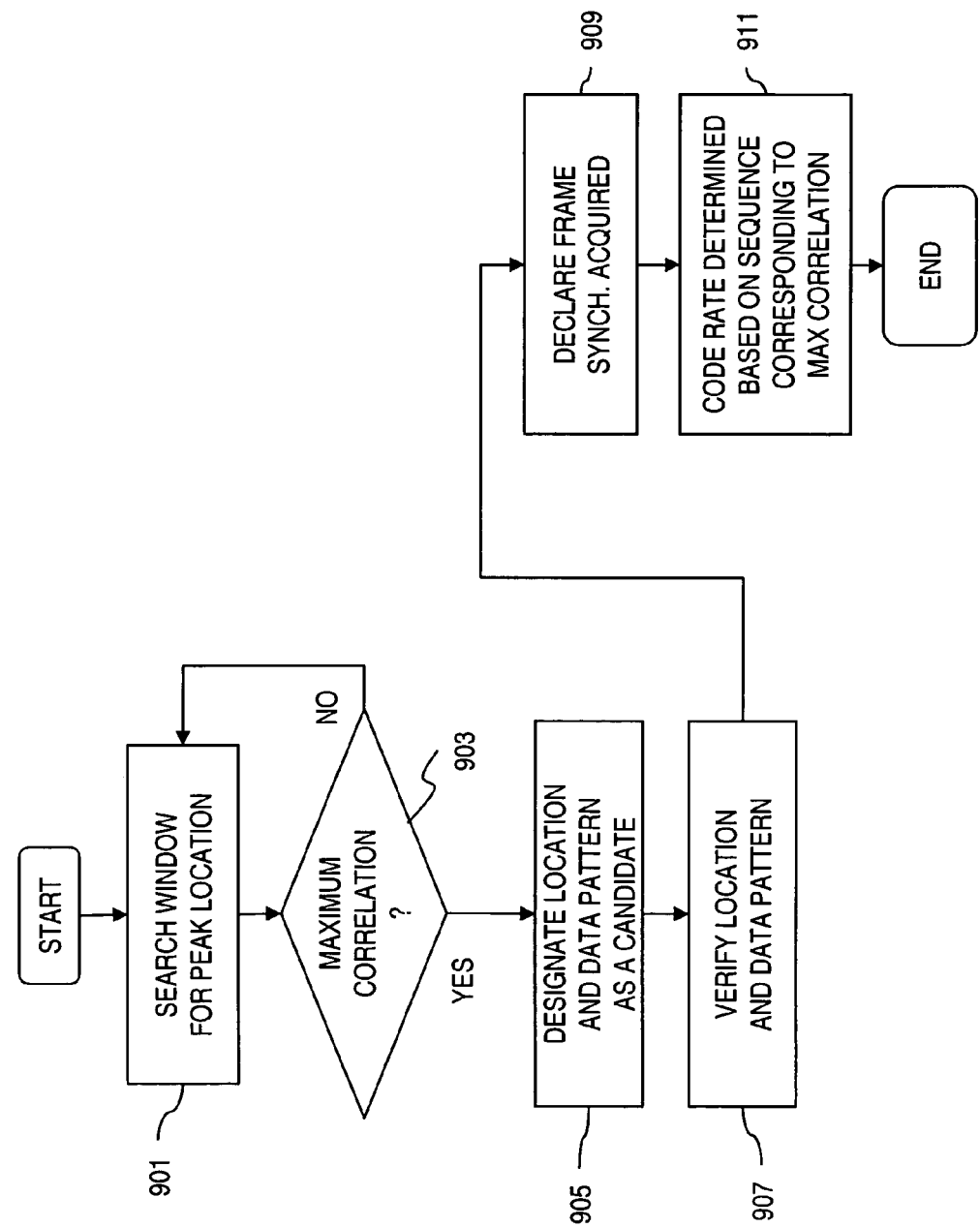
FIG. 9 is a flowchart of a peak search process for locating a data pattern, in accordance with an embodiment of the present invention.

The details of the peak search process, according to an embodiment of the present invention, are shown in FIG. 9. The design of the peak search process stems from the recognition the system 100 may use different code rates and different modulation schemes (e.g., BPSK, QPSK, 8PSK, 16 APSK, and etc.). Even though the modulation scheme may not be known in advance, the maximal distance between unique words 401 is known. The peak search process exploits this knowledge, as next explained.

For example, if the code length of the LDPC is fixed at 64800 bits, for BPSK, the distance between two unique words is 64800 bits. With a data pattern length of 90 bits, the distance between two data pattern is 64890 (i.e., 64800+90) bits. The search window can be set to be equal to this distance value.

By searching over time and data patterns, the detection process finds a peak with the specified search window by determining whether the location corresponds to a maximum correlation—as well as the number of the data pattern for achieving this maximum (steps 901 and 903). The peak location and the data pattern within the search window is designated as a candidate, per step 905, if a maximum correlation has been found. This is a candidate for post-verification. The post verification process simply correlates at the same location, per step 907, in the next block data with the same sequence to check whether sufficient correlation strength presents. Upon verification, then the process declares that frame synchronization is acquired, 909. The code rate of the LDPC is determined based on the data pattern corresponding to the maximum correlation (step 911).

It is contemplated that post verification can be executed over multiple windows to achieve greater reliability. Such a process can be performed serially or in parallel with respect to the candidates until one of them is successfully verified. Simulation studies have revealed that at −5.4 Es/No and 20 Msample/s, the above process achieves frame synchronization with 99.9% confidence in 11 ms.

One way to reduce the search space is to align the frame of the upper layer and the lower layer in a particular way. As such, the frame information of the upper layer can be used as a side information. In one embodiment of the present invention, the upper layer uses 188 bytes frame and coded with a Reed-Soloman code into a 204 bytes, and then coded with a convolutional code of rate 7/8. In this way, one upper layer frame occupies 714 (204*7/2) QPSK symbols. With the upper layer using 64800+90 bits (length of the coded frame and the length of data pattern), if the beginning of the lower layer data pattern were aligned with the first bit of the upper layer frame, the subsequent data pattern of the lower layer can occur only at 17 possible locations out of the total 714 locations. This reduces the search space by a factor of 42! This can be derived as follows. By indexing the 714 QPSK symbols to correspond to the 188 bytes information as 0, 1, 2, . . . 713, the first bit of the data pattern preceding the LDPC can occur only at location of index (64890*n modulo 714) possible locations. It is noted that this alignment does not have adverse impact on the efficiency of the system since both the upper and the lower layer signal leaves no gap in transmission.

Figure 10:
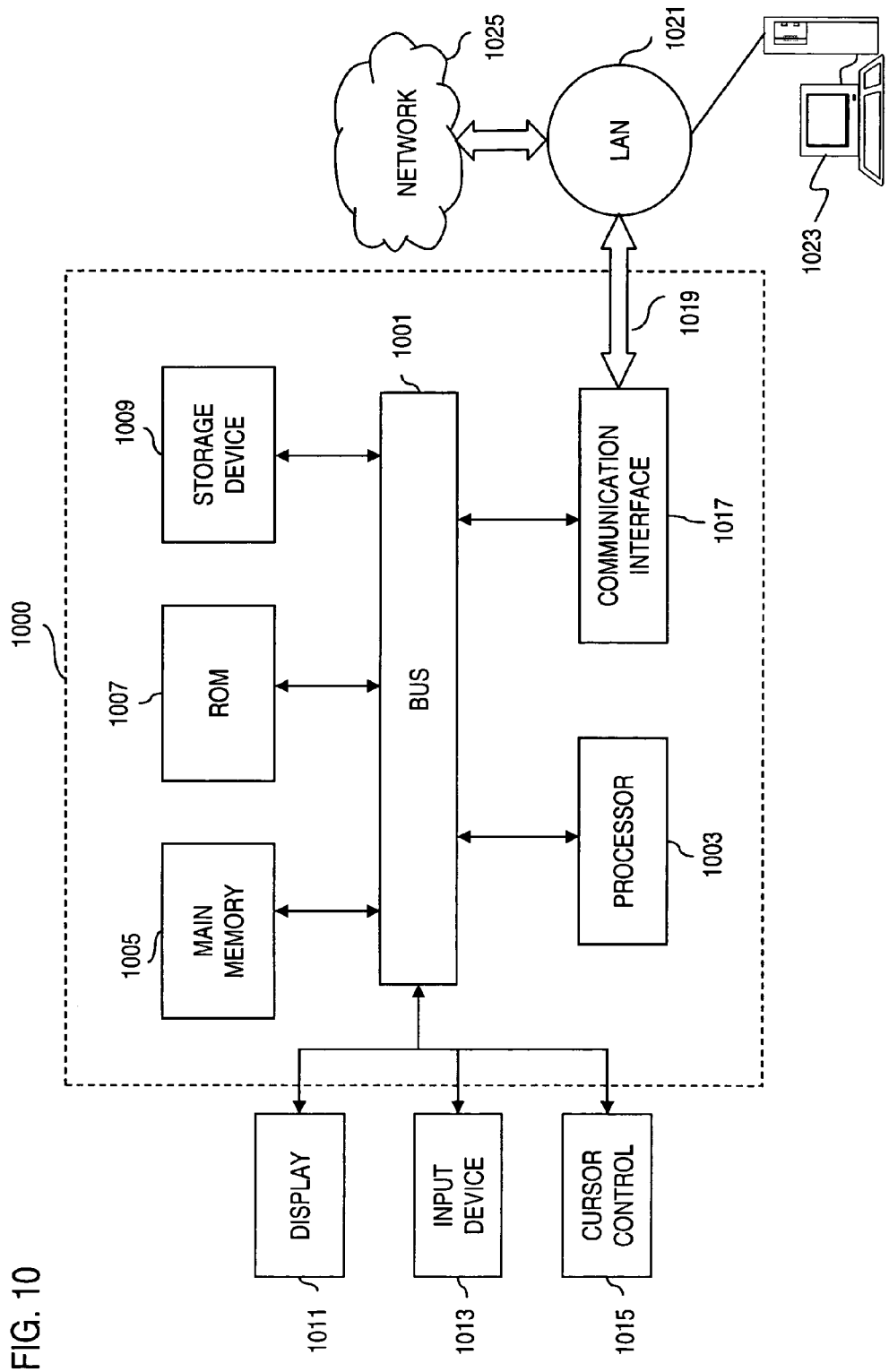
FIG. 10 is a diagram of a computer system that can perform the various processes associated with signal acquisition and frame synchronization, in accordance with embodiments of the present invention.

FIG. 10 illustrates a computer system upon which an embodiment according to the present invention can be implemented. The computer system 1000 includes a bus 1001 or other communication mechanism for communicating information, and a processor 1003 coupled to the bus 1001 for processing information. The computer system 1000 also includes main memory 1005, such as a random access memory (RAM) or other dynamic storage device, coupled to the bus 1001 for storing information and instructions to be executed by the processor 1003. Main memory 1005 can also be used for storing temporary variables or other intermediate information during execution of instructions to be executed by the processor 1003. The computer system 1000 further includes a read only memory (ROM) 1007 or other static storage device coupled to the bus 1001 for storing static information and instructions for the processor 1003. A storage device 1009, such as a magnetic disk or optical disk, is additionally coupled to the bus 1001 for storing information and instructions.

The computer system 1000 may be coupled via the bus 1001 to a display 1011, such as a cathode ray tube (CRT), liquid crystal display, active matrix display, or plasma display, for displaying information to a computer user. An input device 1013, such as a keyboard including alphanumeric and other keys, is coupled to the bus 1001 for communicating information and command selections to the processor 1003. Another type of user input device is cursor control 1015, such as a mouse, a trackball, or cursor direction keys for communicating direction information and command selections to the processor 1003 and for controlling cursor movement on the display 1011.

According to one embodiment of the invention, the various frame synchronization processes can be provided by the computer system 1000 in response to the processor 1003 executing an arrangement of instructions contained in main memory 1005. Such instructions can be read into main memory 1005 from another computer-readable medium, such as the storage device 1009. Execution of the arrangement of instructions contained in main memory 1005 causes the processor 1003 to perform the process steps described herein. One or more processors in a multi-processing arrangement may also be employed to execute the instructions contained in main memory 1005. In alternative embodiments, hard-wired module may be used in place of or in combination with software instructions to implement the embodiment of the present invention. Thus, embodiments of the present invention are not limited to any specific combination of hardware module and software.

The computer system 1000 also includes a communication interface 1017 coupled to bus 1001. The communication interface 1017 provides a two-way data communication coupling to a network link 1019 connected to a local network 1021. For example, the communication interface 1017 may be a digital subscriber line (DSL) card or modem, an integrated services digital network (ISDN) card, a cable modem, or a telephone modem to provide a data communication connection to a corresponding type of telephone line. As another example, communication interface 1017 may be a local area network (LAN) card (e.g. for Ethernet™ or an Asynchronous Transfer Model (ATM) network) to provide a data communication connection to a compatible LAN. Wireless links can also be implemented. In any such implementation, communication interface 1017 sends and receives electrical, electromagnetic, or optical signals that carry digital data streams representing various types of information. Further, the communication interface 1017 can include peripheral interface devices, such as a Universal Serial Bus (USB) interface, a PCMCIA (Personal Computer Memory Card International Association) interface, etc.

The network link 1019 typically provides data communication through one or more networks to other data devices. For example, the network link 1019 may provide a connection through local network 1021 to a host computer 1023, which has connectivity to a network 1025 (e.g. a wide area network (WAN) or the global packet data communication network now commonly referred to as the "Internet") or to data equipment operated by service provider. The local network 1021 and network 1025 both use electrical, electromagnetic, or optical signals to convey information and instructions. The signals through the various networks and the signals on network link 1019 and through communication interface 1017, which communicate digital data with computer system 1000, are exemplary forms of carrier waves bearing the information and instructions.

The computer system 1000 can send messages and receive data, including program code, through the network(s), network link 1019, and communication interface 1017. In the Internet example, a server (not shown) might transmit requested code belonging to an application program for implementing an embodiment of the present invention through the network 1025, local network 1021 and communication interface 1017. The processor 1003 may execute the transmitted code while being received and/or store the code in storage device 109, or other non-volatile storage for later execution. In this manner, computer system 1000 may obtain application code in the form of a carrier wave.

The term "computer-readable medium" as used herein refers to any medium that participates in providing instructions to the processor 1003 for execution. Such a medium may take many forms, including but not limited to non-volatile media, volatile media, and transmission media. Non-volatile media include, for example, optical or magnetic disks, such as storage device 1009. Volatile media include dynamic memory, such as main memory 1005. Transmission media include coaxial cables, copper wire and fiber optics, including the wires that comprise bus 1001. Transmission media can also take the form of acoustic, optical, or electromagnetic waves, such as those generated during radio frequency (RF) and infrared (IR) data communications. Common forms of computer-readable media include, for example, a floppy disk, a flexible disk, hard disk, magnetic tape, any other magnetic medium, a CD-ROM, CDRW, DVD, any other optical medium, punch cards, paper tape, optical mark sheets, any other physical medium with patterns of holes or other optically recognizable indicia, a RAM, a PROM, and EPROM, a FLASH-EPROM, any other memory chip or cartridge, a carrier wave, or any other medium from which a computer can read.

Various forms of computer-readable media may be involved in providing instructions to a processor for execution. For example, the instructions for carrying out at least part of the present invention may initially be borne on a magnetic disk of a remote computer. In such a scenario, the remote computer loads the instructions into main memory and sends the instructions over a telephone line using a modem. A modem of a local computer system receives the data on the telephone line and uses an infrared transmitter to convert the data to an infrared signal and transmit the infrared signal to a portable computing device, such as a personal digital assistance (PDA) and a laptop. An infrared detector on the portable computing device receives the information and instructions borne by the infrared signal and places the data on a bus. The bus conveys the data to main memory, from which a processor retrieves and executes the instructions. The instructions received by main memory may optionally be stored on storage device either before or after execution by processor.

Accordingly, the various embodiments of the present invention provide an approach for achieving rapid signal acquisition and frame synchronization in a digital broadcast system utilizing Low Density Parity Check (LDPC) codes.

While the present invention has been described in connection with a number of embodiments and implementations, the present invention is not so limited but covers various obvious modifications and equivalent arrangements, which fall within the purview of the appended claims.

What is claimed is:

1. A method for generating a signal in a communication system, the method comprising the steps of:

receiving, via circuitry, an upper layer data stream associated with a first modulation scheme and a lower layer data stream associated with a second modulation scheme;

coding the lower layer data stream according to a sequence among a plurality of sequences specifying respective data patterns corresponding to different code rates;

modulating the upper layer data stream and the coded lower layer data stream according to respective ones of the first and second modulation schemes;

multiplying the modulated upper layer data stream and lower layer data stream to generate a multiplied signal; and transmitting the multiplied signal over a communications channel.

2. A method according to claim 1, wherein the data patterns are of equal length.

3. A method according to claim 1, wherein the lower layer data stream is encoded according to Low Density Parity Check (LDPC) coding.

4. A method according to claim 3, wherein the upper layer data stream is encoded according to convolutional coding.

5. A method according to claim 1, wherein the first modulation scheme is of a higher order than the second modulation scheme.

6. A method according to claim 5, wherein the first modulation scheme is Quadrature Phase Shift Keying (QPSK) and the second modulation scheme is Binary Phase Shift Keying (BPSK).

7. A method according to claim 1, wherein the data patterns include:

10010000111010011110110100011000001101100000001000110000010111101011001000101010011100101011110101100000101010101100011010001101001000110000011001101011001000111100100001101100000001010011100101010001001101011110100000110010000000110110000011000101101111001011100001001000000110110000100111100010011010110011000001100010010110001011000110101010100000110101111.

8. A method according to claim 1, wherein the upper layer data stream has a first Digital Video Broadcast (DVB) format, and the lower layer data stream has a second DVB format that is different from the first DVB format.

9. A method according to claim 1, wherein the communication system is a satellite network.

10. A method according to claim 1, wherein the code rate is derived based on a corresponding one of the data patterns without an explicit field being designated to specify the code rate.

11. An apparatus for generating a signal in a communication system, the apparatus comprising:

hierarchical modulation circuitry configured to receive an upper layer data stream associated with a first modulation scheme and a lower layer data stream associated with a second modulation scheme, to code the lower layer data stream according to a sequence among a plurality of sequences specifying respective data patterns corresponding to different code rates, to modulate the upper layer data stream and the coded lower layer data stream according to respective ones of the first modulation scheme and the second modulation scheme and to multiply the modulated upper layer data stream and lower layer data stream to generate a multiplied signal; and transmit circuitry configured to transmit the multiplied signal on a communications channel.

12. An apparatus according to claim 11, wherein the data patterns are of equal length.

13. An apparatus according to claim 11, wherein the lower layer data stream is encoded according to Low Density Parity Check (LDPC) coding.

14. An apparatus according to claim 13, wherein the upper layer data stream is encoded according to convolutional coding.

15. An apparatus according to claim 11, wherein the first modulation scheme is of a higher order than the second modulation scheme.

16. An apparatus according to claim 15, wherein the first modulation scheme is Quadrature Phase Shift Keying (QPSK) and the second modulation scheme is Binary Phase Shift Keying (BPSK).

17. An apparatus according to claim 11, the data patterns include:

10010000111010011110110100011000001101100000001000110000010111101011001000101010011100101011110101100000101010101100011010001101001000110000011001101011001000111100100001101100000001010011100101010001001101011110100000110010000000110110000011000101101111001011100001001000000110110000100111100010011010110011000001100010010110001011000110101010100000110101111.

18. An apparatus according to claim 11, wherein the upper layer data stream has a first Digital Video Broadcast (DVB) format, and the lower layer data stream has a second DVB format that is different from the first DVB format.

19. An apparatus according to claim 11, wherein the communication system is a satellite network.

* * * * *